(12) United States Patent
Kurihara (10) Patent No.: US 7,180,785 B2
(45) Date of Patent: Feb. 20, 2007

(54) NONVOLATILE SEMICONDUCTOR MEMORY DEVICE WITH A PLURALITY OF SECTORS

(75) Inventor: Kazuhiro Kurihara, Kawasaki (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/085,496

(22) Filed: Mar. 22, 2005

(65) Prior Publication Data

US 2005/0162911 A1 Jul. 28, 2005

Related U.S. Application Data

(63) Continuation of application No. PCT/JP03/04921, filed on Apr. 17, 2003.

(51) Int. Cl.
*G11C 16/06* (2006.01)
*G11C 16/04* (2006.01)

(52) U.S. Cl. .................. 365/185.23; 365/185.11; 365/185.13; 365/185.18; 365/230.06

(58) Field of Classification Search ............ 365/185.23
See application file for complete search history.

(56) References Cited

U.S. PATENT DOCUMENTS

| 5,295,113 A | * | 3/1994 | Dix et al. ................ 365/228 |
| 5,532,971 A | | 7/1996 | Tanaka et al. |
| 5,652,450 A | | 7/1997 | Hirano |
| 5,818,758 A | * | 10/1998 | Wojciechowski ...... 365/185.18 |
| 5,898,606 A | * | 4/1999 | Kobayashi et al. ........... 365/63 |
| 5,966,331 A | | 10/1999 | Shiau et al. |
| 5,995,417 A | | 11/1999 | Chen et al. |
| 6,021,083 A | | 2/2000 | Shiau et al. |
| 6,044,020 A | * | 3/2000 | Chung et al. .......... 365/185.23 |
| 6,304,488 B1 | * | 10/2001 | Abedifard et al. ..... 365/185.23 |
| 6,377,502 B1 | * | 4/2002 | Honda et al. .......... 365/230.03 |
| 6,463,004 B2 | * | 10/2002 | Guliani et al. ......... 365/230.03 |
| 6,768,674 B2 | * | 7/2004 | Park ...................... 365/185.13 |
| 6,788,584 B2 | * | 9/2004 | Tedrow et al. ......... 365/189.04 |

FOREIGN PATENT DOCUMENTS

| JP | 7-169282 | 7/1995 |
| JP | 9-55093 | 2/1997 |
| JP | 2000-508463 | 7/2000 |
| WO | WO 99/30326 A1 | 6/1999 |
| WO | WO 00/24002 A1 | 4/2000 |

* cited by examiner

*Primary Examiner*—Son L. Mai
(74) *Attorney, Agent, or Firm*—Arent Fox LLP (57) ABSTRACT

A nonvolatile semiconductor memory device is disclosed that comprises plural sectors each including a memory cell array, plural word line drivers provided in each one of the sectors to drive respective word lines, and sector switches provided one for each sector. The sector switches are connected to the plural word line drivers in the corresponding sector, adapted to provide a negative voltage to be applied to the word lines to the plural word line drivers when the corresponding sector is selected for an erase operation. The sector switches only include transistors directly connected to an output signal line to provide the negative voltage to the word line drivers. A decoding circuit shared by one or more sectors is adapted to control the sector switches to allow a sector switch in a selected sector to output the negative voltage and allow a sector switch in an unselected sector to output a voltage different from the negative voltage.

20 Claims, 12 Drawing Sheets

| AENh/NENh | NEGPXv/NEGPXBv | XDSn |
|---|---|---|
| Vcc/NEGP | NEGP/NEGP | Vss |
| Vcc/NEGP | Vss/Vcc | Vss |
| NEGP/Vss | NEGP/NEGP | NEGP |
| NEGP/Vss | Vss/Vcc | Vss |

| AENh/NENh | NEGPXv | XDSn |
|---|---|---|
| Vcc/NEGP | NEGP | Vss |
| Vcc/NEGP | Vss | Vss |
| NEGP/Vss | NEGP | NEGP |
| NEGP/Vss | Vss | Floating |

NONVOLATILE SEMICONDUCTOR MEMORY DEVICE WITH A PLURALITY OF SECTORS

CROSS-REFERENCE TO RELATED APPLICATIONS

This application is a U.S. continuation application filed under 35 USC 111(a) claiming benefit under 35 USC 120 and 365(c) of PCT application JP2003/004921, filed on Apr. 17, 2003, the entire contents of which are incorporated herein by reference.

BACKGROUND OF THE INVENTION

1. Field of the Invention

The present invention generally relates to a nonvolatile semiconductor memory device, and particularly relates to a nonvolatile semiconductor memory device adapted to erase data on a whole sector at a time.

2. Description of the Related Art

Nonvolatile semiconductor memory devices are designed to write data by a programming operation of injecting charges into a gate of a memory cell transistor, and to erase data by an erasing operation of removing charges from the gate of the memory cell transistor. The programming and erasing operations are executed by applying a voltage predetermined for each operation to respective terminals of the gate, the drain and the source of the memory cell transistor. The predetermined voltage must be a voltage higher than an external supply voltage supplied from the outside or a negative voltage lower than a ground voltage. The nonvolatile semiconductor memory devices therefore include internal program voltage and erase voltage generating circuits to generate a high voltage and a negative voltage.

In word line voltage control, the high voltage for programming generated by the program voltage generating circuit is applied to a selected word line in a selected sector via an X-decoder circuit. The negative voltage for erasure generated by the erase voltage generating circuit is applied to word lines in a selected sector via the X-decoder circuit.

Figure 1:
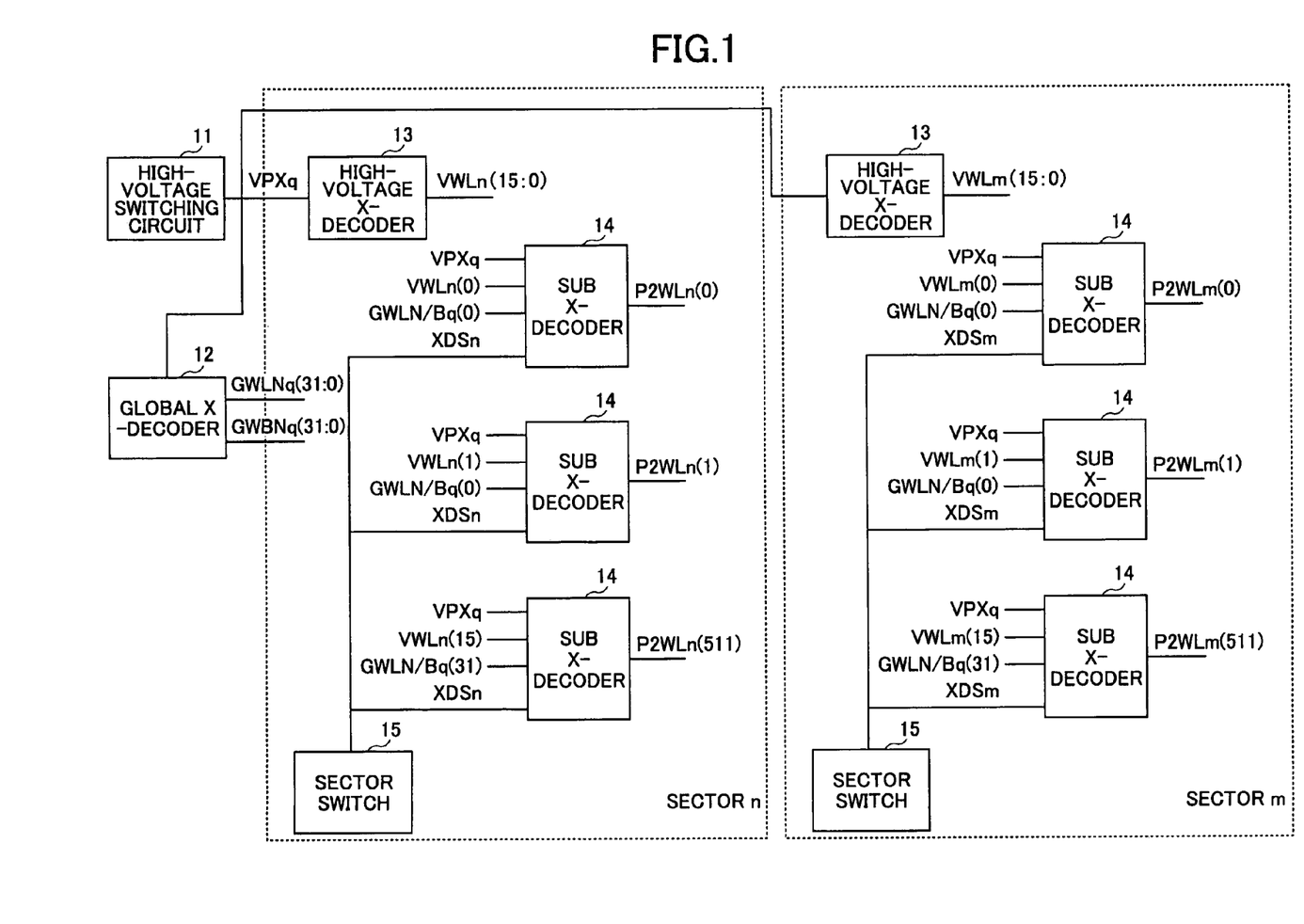
FIG. 1 is a schematic diagram of an X-decoder circuit.

FIG. 1 is a schematic diagram of an X-decoder circuit. This X-decoder circuit is provided one for each block. If there are plural blocks, that same number of X-decoder circuits of FIG. 1 are provided. The X-decoder circuit is configured to be connected to plural sectors. (e.g. sectors S1, S2 in FIG. 1).

The X-decoder circuit of FIG. 1 includes a high-voltage switching circuit 11, a global X-decoder 12, high-voltage X-decoders 13, sub X-decoders (word line drives) 14, and sector switches 15. The high-voltage switching circuit 11 and the global X-decoder 12 are shared by the plural sectors. The high-voltage X-decoder 13, plural sub X decoders 14, and the sector switch 15 are respectively provided in each of the plural sectors.

Figure 2:
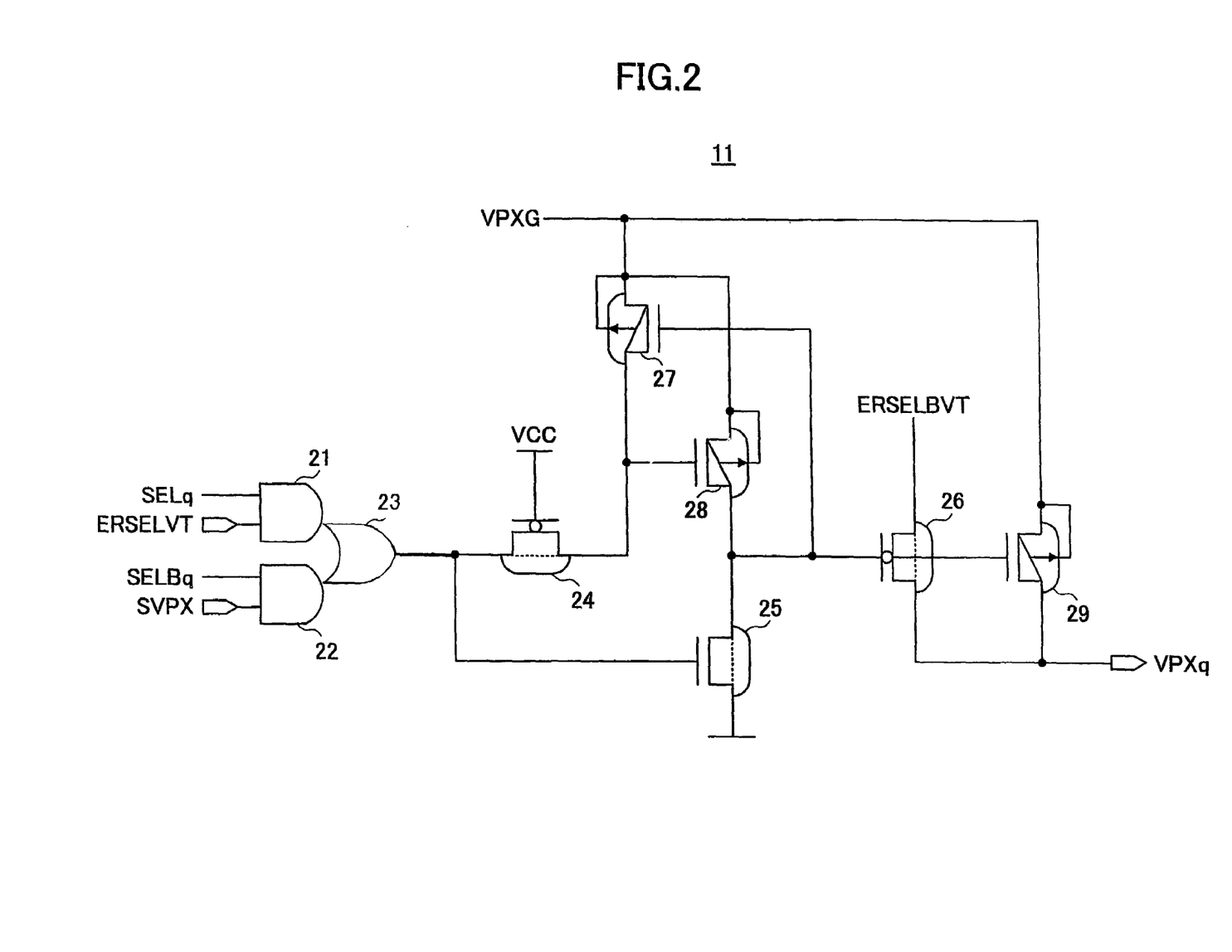
FIG. 2 is a circuit diagram of a high-voltage switching circuit.

FIG. 2 is a circuit diagram of the high-voltage switching circuit 11.

The high-voltage switching circuit 11 of FIG. 2 includes AND circuits 21 and 22, an OR circuit 23, NMOS transistors 24 through 26, and PMOS transistors 27 through 29. A signal SELq is a signal for selecting a corresponding block, and a signal SELBq is an inversion signal of the signal SELq. A signal ERSELVT is normally LOW (ground voltage Vss), and becomes HIGH (supply voltage Vcc) in the erase operation. A signal ERSELBVT is normally HIGH (supply voltage Vcc), and becomes LOW (ground voltage Vss) in the erase operation. A signal SVPX becomes HIGH in the read/program operation. VPXG is an input high voltage.

The output voltage VPXq applied to a block selected for the read/program operation is the input high voltage VPXG, because SVPX=H, SELq=H, and ERSELVT=L. On the other hand, the output voltage VPXq applied to a block unselected for the read/program operation is the ERSELBVT, because SVPX=H, and SELq=L. The voltage ERSELBVT is Vcc in the read operation.

The output voltage VPXq applied to a block selected for the erase operation is 0 V, because ERSELVT=H, and SVPX=L. On the other hand, the output voltage VPXq=VPXG=Vcc is applied to a block unselected for the erase operation.

Figure 3:
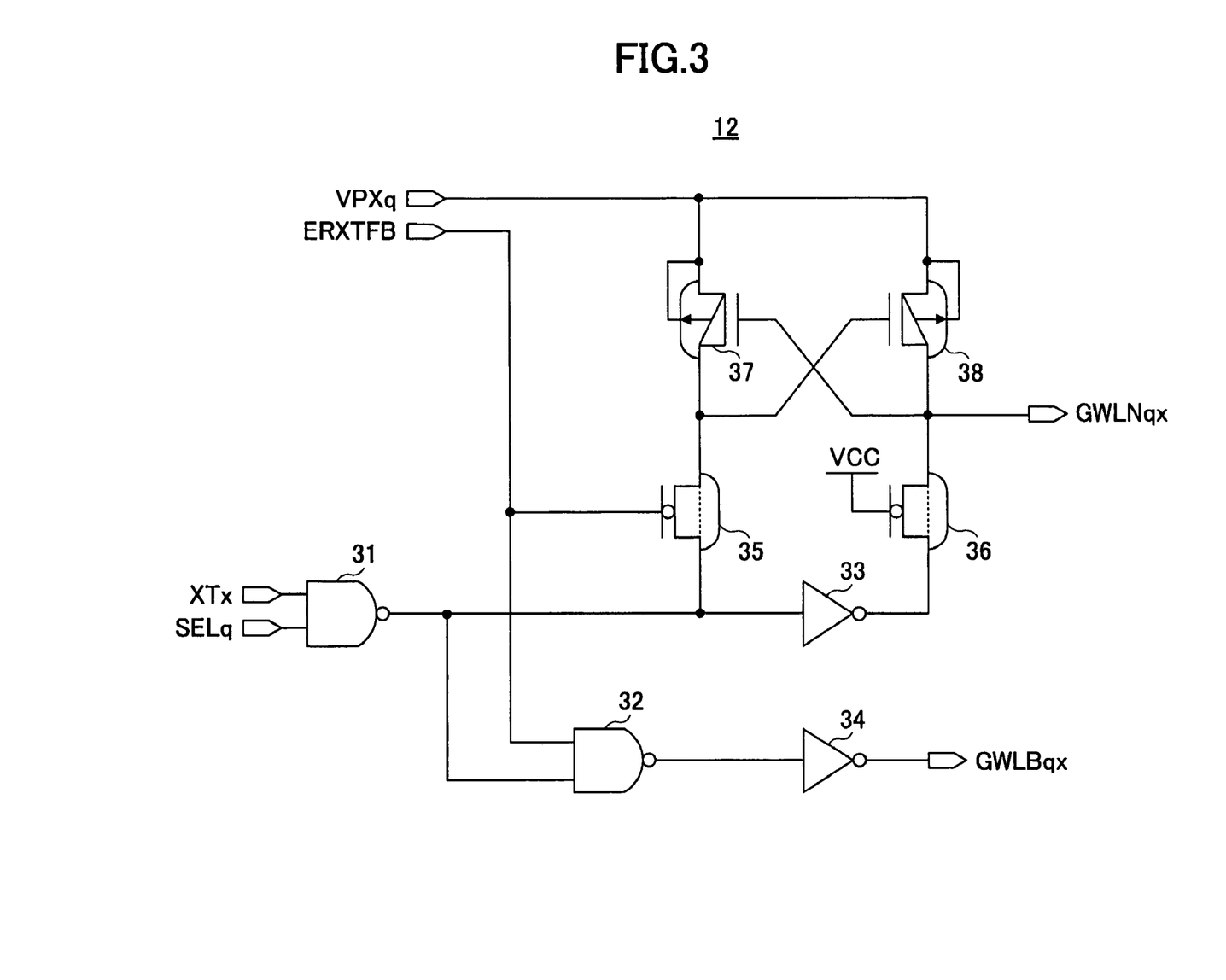
FIG. 3 is a circuit diagram of a global X-decoder.

FIG. 3 is a circuit diagram of the global X-decoder 12.

The global X-decoder 12 of FIG. 3 includes NAND circuits 31 and 32, inverters 33 and 34, NMOS transistors 35 and 36, and PMOS transistors 37 and 38. The global X-decoder 12 applies GWLNqx=VPXq, and GWLBqx=0 V to a block selected for the read/program operation. On the other hand, the global X-decoder 12 applies GWLNqx=0 V, and GWLBqx=Vcc to a block unselected for the read/program operation. The output signals GWLNqx and GWLBqx are globally applied to the sectors. In the erase operation, VPXq=0 V, ERXTFB=0 V, and XTx=0 V, and therefore GWLNqx=0 V, and GWLBqx=0 V.

Thirty two pieces of the circuits of FIG. 3 are respectively provided for 32 lines of GWLNq (31:0) and GWLBq (31:0). The global X-decoder 12 is constituted with all these circuits (see FIG. 1). The GWLNqx and GWLBqx described above respectively correspond to single lines of GWLNq (31:0) and GWLBq (31:0).

Figure 4:
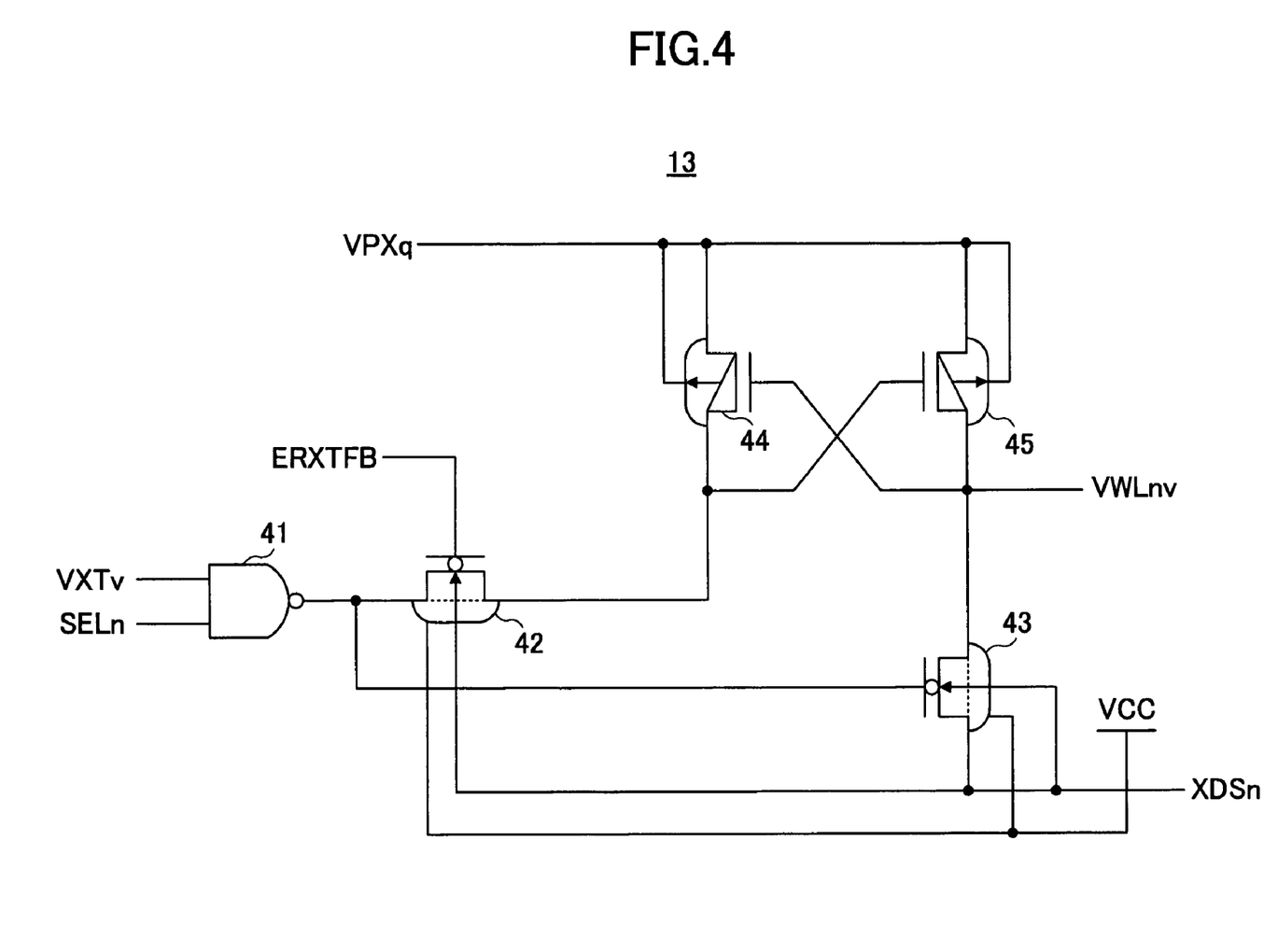
FIG. 4 is a circuit diagram of a high-voltage X decoder.

FIG. 4 is a circuit diagram of the high-voltage X-decoder 13.

The high-voltage X-decoder 13 of FIG. 4 includes a NAND circuit 41, NMOS transistors 42 and 43, and PMOS transistors 44 and 45. The PMOS transistors 44 and 45 serve as a level shifter for converting logic in Vcc level into logic in Vpx level. A signal ERXTFB becomes LOW and sets a pass gate OFF in the erase operation. A signal VXTv, which is a signal converted from an address signal, becomes HIGH when a corresponding VWL is selected for the decoding operation. A signal SELn becomes HIGH when a sector is selected. XDS, which is a voltage signal, is normally 0 V and becomes a negative voltage NEGP (e.g. −6 V) in the erase operation.

When the read/program operation is selected, VWLnv=VPXq. When the read/program operation is unselected, VWLnv=0 V. In the erase operation, VPXq=0 V, VXTv=SELn=H, and XDSn=NEGP, and therefore VWLnv=NEGP. Herein, NEGP is a negative voltage in the erase operation as shown in the above.

Sixteen pieces of the circuits of FIG. 4 are respectively provided for 16 lines of VWLn (15:0). The high-voltage X-decoder 13 is constituted with all these circuits (see FIG. 1). The VWLnv of FIG. 4 described above corresponds to a single line of VWLn (15:0). The high-voltage X-decoder 13 is provided one for each sector.

Figure 5:
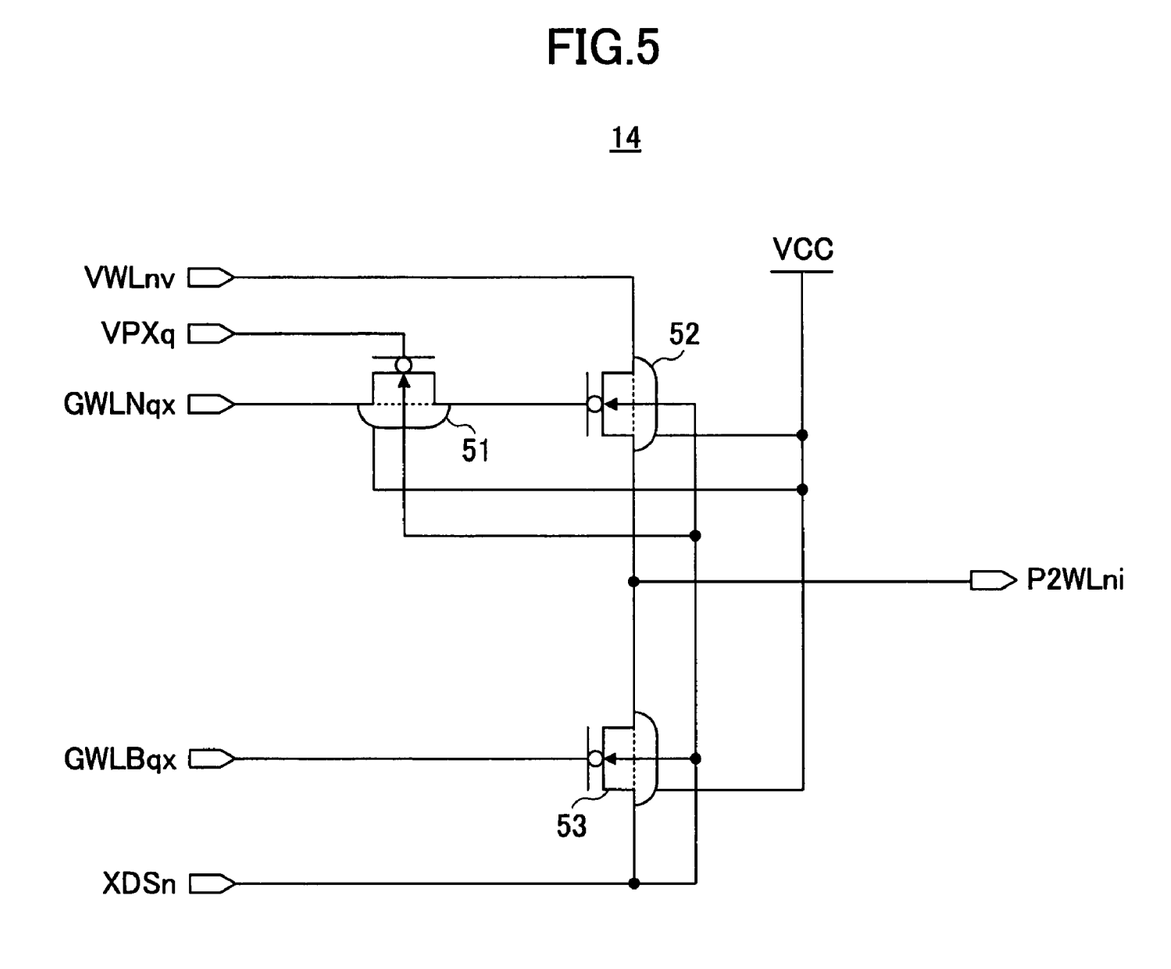
FIG. 5 is a circuit diagram of a sub X-decoder.

FIG. 5 is a circuit diagram of the sub X-decoder 14.

The sub X-decoder (word line driver) 14 of FIG. 5 includes NMOS transistors 51 through 53. The sub X-decoder 14 receives VWLnv from the high-voltage X-decoder 13, VPXq from the high-voltage switching circuit 11, GWLNqx and GWLBqx from the global X-decoder 12, and XDSn from the sector switch 15. According to these signals, the sub X-decoder 14, serving as a word line driver, drives a word line.

When a word line is selected for the read/program operation, GWLNqx=VPXq, GWLBqx=0 V, and VWLnv=VPXq. Therefore, a high voltage is applied to a word line P2WLni. When a word line is selected for the erase operation, VPXq=0 V, VWLnv=XDSn=NEGP, and GWLNqx=GWLBqx=0 V. Therefore, a negative voltage NEGP is applied to the word line P2WLni.

Figure 6:
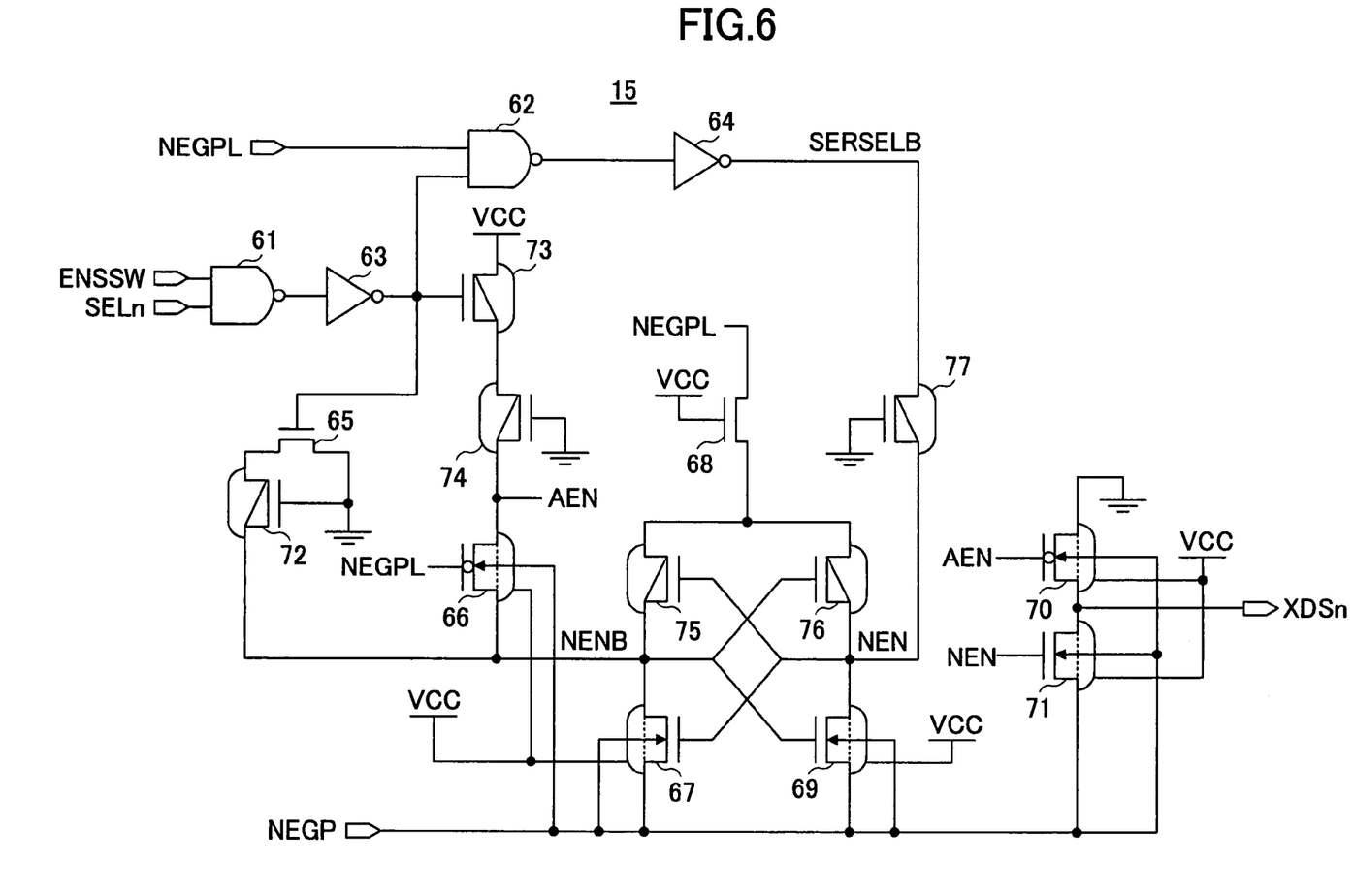
FIG. 6 is a circuit diagram of a sector switch.

FIG. 6 is a circuit diagram of the sector switch 15.

The sector switch 15 of FIG. 6 includes NAND circuits 61 and 62, inverters 63 and 64, NMOS transistors 65 through 71, and PMOS transistors 72 through 77. A signal ENSSW is an Enable signal for this circuit. A signal SELn is a sector selection signal as previously mentioned. NEGP is a negative voltage supplied from a pump circuit. A signal NEGPL is a negative voltage detection signal, which is switched from Vcc to 0 V when the negative voltage signal NEGP falls below a predetermined negative voltage level.

An output voltage signal XDSn is a negative voltage when in a selected sector, and is 0 V when in an unselected sector. Specifically, in the selected sector, signals AEN and NEN in the circuit are respectively NEGP and 0 V, and therefore the output voltage signal XDSn=NEGP. In the unselected sector, signals AEN and NEN are respectively Vcc and NEGP, and therefore XDSn=0 V.

The sector switch 15, provided one for each sector, supplies a negative voltage for erasure to the sub X-decoders 14 when a corresponding sector is selected for the erase operation. Thus the erase operation is executed in the sector.

The high-voltage switching circuit 11 shown in FIG. 2 is shared by the sectors, thereby allowing a reduction of the circuit area. The reason that the sharing of the high-voltage switching circuit 11 is applicable is because the word line can be selected by the decoding operation of GWL/VWL in the read/program operation.

In contrast, the sector switch 15 shown in FIG. 6 is provided one for each sector. The size of the sector switch 15 is large because the sector switch 15 includes a level shifter for controlling a negative voltage to be applied to a selected sector and a decoding circuit for generating the signals AEN and NEN. Therefore, having the sector switch 15 one for each sector is disadvantageous in that the circuit area occupied by the sector switches 15 increases in proportion to the number of the sectors (an example of related art is described in U.S. Pat. No. 5,995,417, also published as WO00/24002, and its Japanese translation 2002-528841).

SUMMARY OF THE INVENTION

In view of the foregoing, a general object of the present invention is to provide a nonvolatile semiconductor memory device to overcome at least one disadvantage mentioned above. A specific object of the present invention is to provide a nonvolatile semiconductor memory device with less circuit area occupied by a sector switch.

A nonvolatile semiconductor memory device according to the present invention comprises a plurality of sectors each including a memory cell array, a plurality of word line drivers provided in each one of the sectors to drive respective word lines, sector switches provided one for each sector, connected to the word line drivers in the corresponding sector, adapted to provide a negative voltage to be applied to the word lines to the word line drivers when the corresponding sector is selected for an erase operation, and only including transistors directly connected to an output signal line to provide the negative voltage to the word line drivers, and a decoding circuit shared by one or more sectors, adapted to control the sector switches to allow a sector switch in a selected sector to output the negative voltage and allow a sector switch in an unselected sector to output a voltage different from the negative voltage.

The sector switches of the nonvolatile semiconductor memory device are provided one for each sector, and the sector is selected by decoder circuits each shared by one or more sectors. A negative voltage for erasure is provided only to the selected sector. Each sector switch only comprises transistors directly connected to a signal output line for providing a negative voltage, and other decoding functions are arranged outside the sectors as the decoder circuit shared by one or more sectors. Accordingly, the sector switch provided in the respective sector can be formed as a small circuit only having driver transistors, thereby allowing considerable reduction of the circuit area.

DETAILED DESCRIPTION OF THE PREFERRED EMBODIMENT

Preferred embodiments of the present invention are described in detail below referring to the accompanying drawings.

Figure 7:
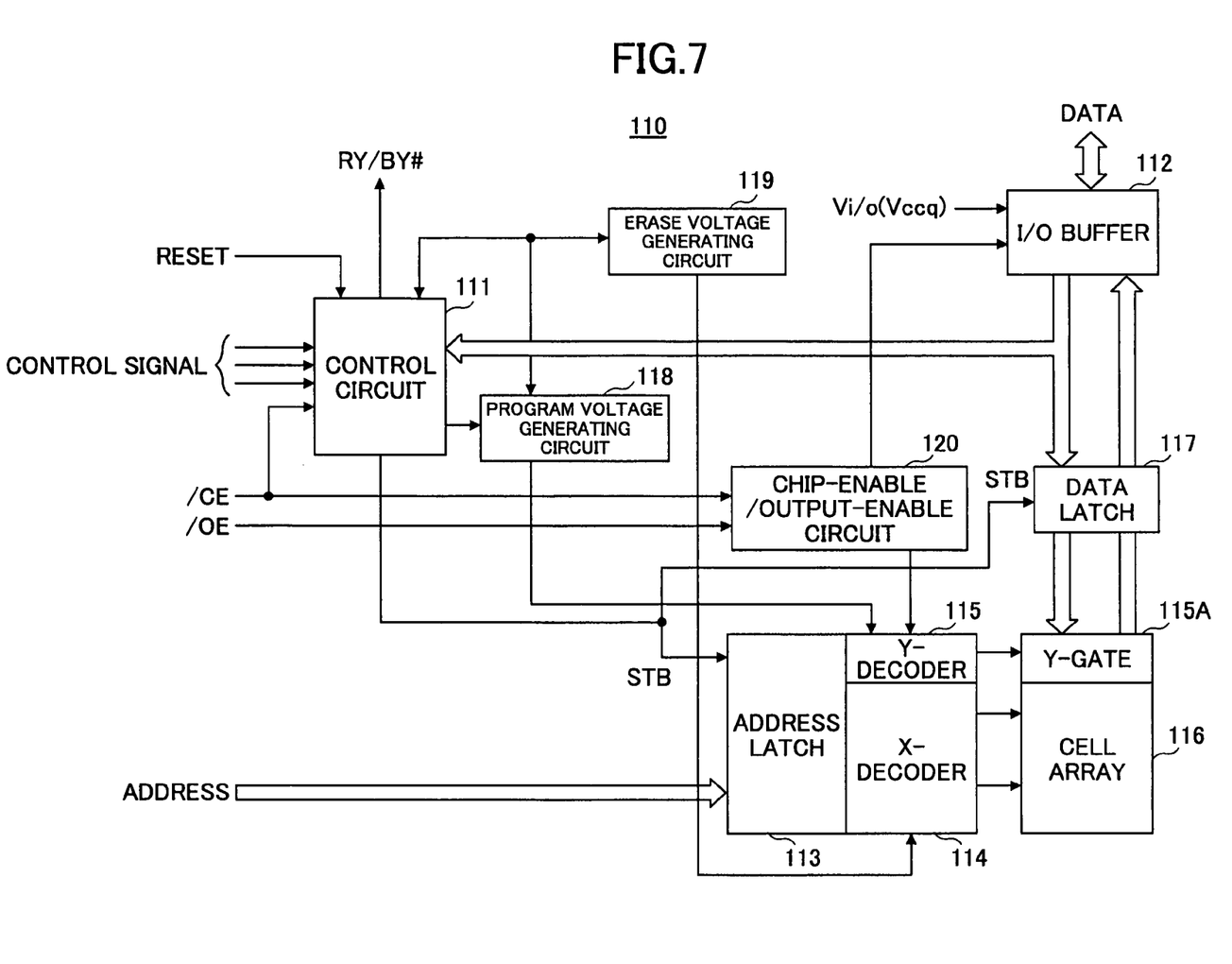
FIG. 7 is a schematic diagram of a nonvolatile semiconductor memory device according to the present invention.

FIG. 7 shows a schematic diagram of a nonvolatile semiconductor memory device 110 according to the present invention.

The nonvolatile semiconductor memory device 110 comprises a control circuit 111, an input/output buffer 112, an address latch 113, an X-decoder 114, a Y-decoder 115, a cell array 116, a data latch 117, a program voltage generating circuit 118, an erase voltage generating circuit 119, and a chip-enable/output-enable circuit 120.

The control circuit 111 receives a control signal from the outside, and functions as a state machine according to the control signal to control the operations of each element of the nonvolatile semiconductor memory device 110.

The input/output buffer 112 receives data from the outside and supplies the data to the data latch 117. The address latch 113 receives, or latches, an address signal from the outside, and supplies the address signal to the X-decoder 114 and the Y-decoder 115. The X-decoder 114 decodes the address supplied from the address latch 113, and activates word lines arranged in the cell array 116 according to the decoded result. The Y-decoder 115 decodes the address supplied from the address latch 113, and selectively opens and closes a Y-gate 115A according the decoded address signal. The Y-gate 115A selectively connects bit lines of the cell array 116 to the data latch 117.

The cell array 116 comprises an array of memory cell transistors, word lines, and bit lines, and stores data in each of the memory cell transistors. In a data read operation, data in memory cells specified by the activated word line are read out to the bit lines. In the program/erase operation, the word lines and the bit lines are set to potentials appropriate for each operation, and thus charges are injected into or removed from the memory cells. The cell array 116 is divided into plural sectors, each of which has a memory cell array. The erase operation is executed by sector.

The data latch 117 compares the current of the data supplied from the cell array 116 specified by the Y-decoder 115 and the X-decoder 114 with a reference current to identify whether the data element is 0 or 1. The identification result is supplied as read-out data to the input/output buffer 112. A verify operation for the program/erase operation is executed by comparing the current of the data supplied from the cell array 116 specified by the Y-decoder 115 and the X-decoder 114 with a reference current indicated by a reference cell for program verify/erase verify. In the programming operation, write data are stored in a register of the data latch 117, and the word lines and the bit lines of the cell array 116 are set to appropriate potentials based on the data. The charges are thus injected into the memory cells.

The program voltage generating circuit 118 generates a high voltage for programming under the control of the control circuit 111. The high voltage for programming is applied to the cell array 116 through the X-decoder 114, so that the data writing operation is executed based on the write data stored in the data latch 117. The erase voltage generating circuit 119 generates a negative voltage for erasure under the control of the control circuit 111. The negative voltage for erasure is applied to the cell array 116 through the X-decoder 114, so that the erase operation by sector is executed in the cell array 116.

The chip-enable/output-enable circuit 120 receives a chip-enable signal (/CE) and an output-enable signal (/OE) from an external device to control the activation and inactivation of the input/output buffer 112 and the cell array 116.

Figure 8:
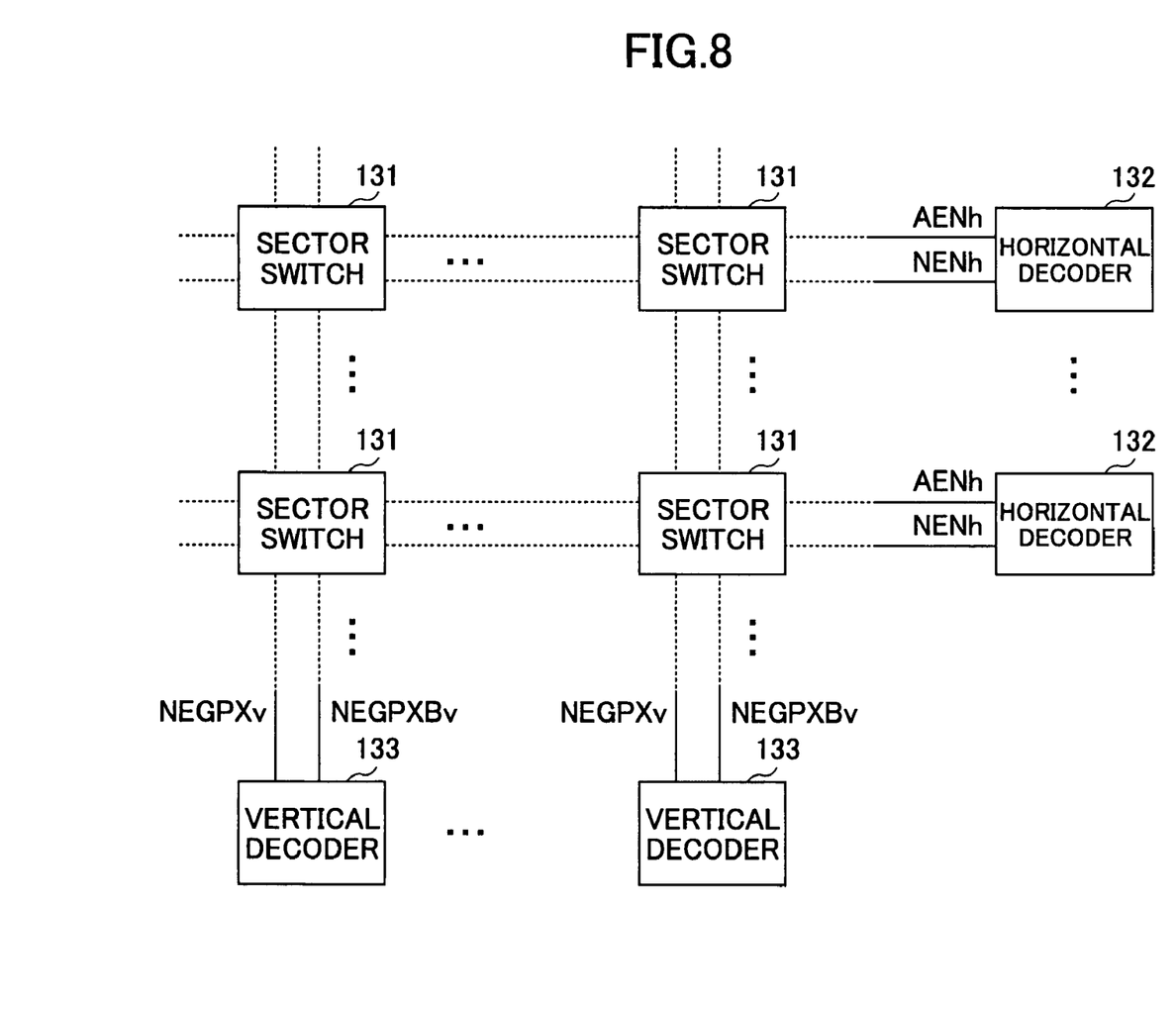
FIG. 8 is a schematic diagram of a sector switching circuit according to the present invention.

FIG. 8 shows a schematic diagram of a sector switching circuit according to the present invention.

The sector switching circuit of FIG. 8 comprises sector switches 131 provided one for each sector, horizontal decoders 132 for selecting respective horizontal sector rows, and vertical decoders 133 for selecting respective vertical sector rows. Plural sectors are horizontally and vertically arranged in a matrix form. The sector switches 131 provided one for each sector are also arranged horizontally and vertically. When a horizontal sector row and a vertical sector row are respectively selected by the horizontal decoder 132 and the vertical decoder 133, one sector switch 131 is selected.

It should be understood that, although AENh/NENh are illustrated as signals provided to sector rows in the horizontal direction and NEGPXv/NEGPXBv as signals provided to sector rows in the vertical direction in FIG. 8, the signals in the horizontal and vertical directions may be replaced with each other. Also, all the horizontal decoders 132 and the vertical decoders 133 may be arranged in one of the horizontal or vertical direction to allow the decoding from the same direction.

The configuration of the above-described related art is applicable to the present invention except for the sector switching circuit, and therefore the circuits shown in FIGS. 2 through 5 may be employed for the X-decoding operation. That is, the present invention employs the sector switches 131 provided in the respective sectors in place of the sector switches 15 provided in the respective sectors in FIG. 1.

Figure 9:
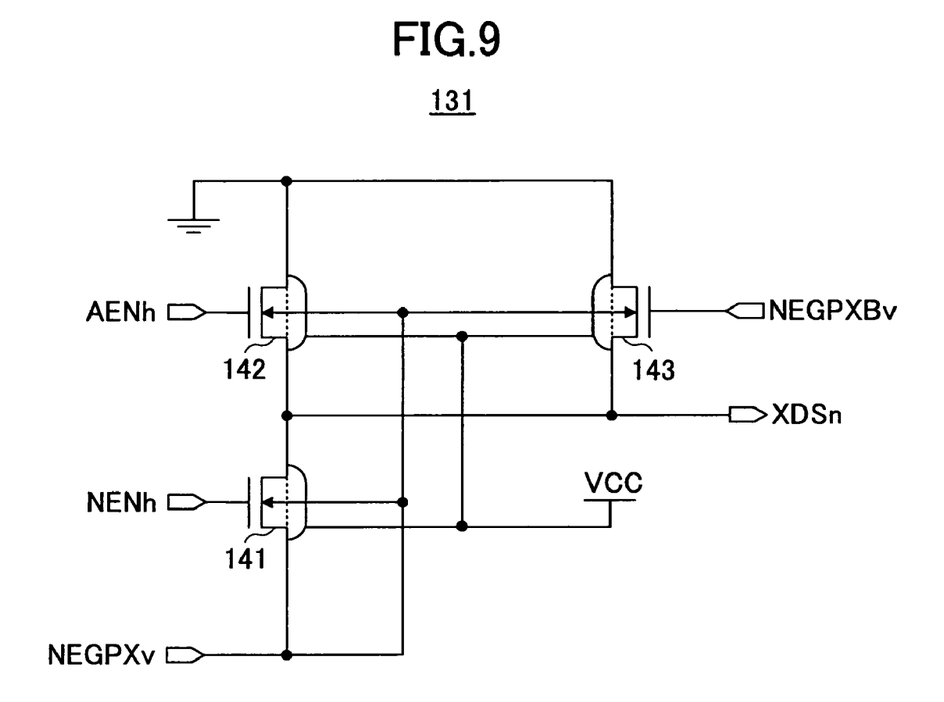
FIG. 9 is a circuit diagram of a sector switch.

FIG. 9 shows a circuit diagram of the sector switch 131.

The sector switch 131 comprises NMOS transistors 141 through 143. The signals AENh/NENh are provided to a horizontal sector row by the horizontal decoder 132. The signals NEGPXv/NEGPVBv are provided to a vertical sector row by the vertical decoder 133.

Figure 10:
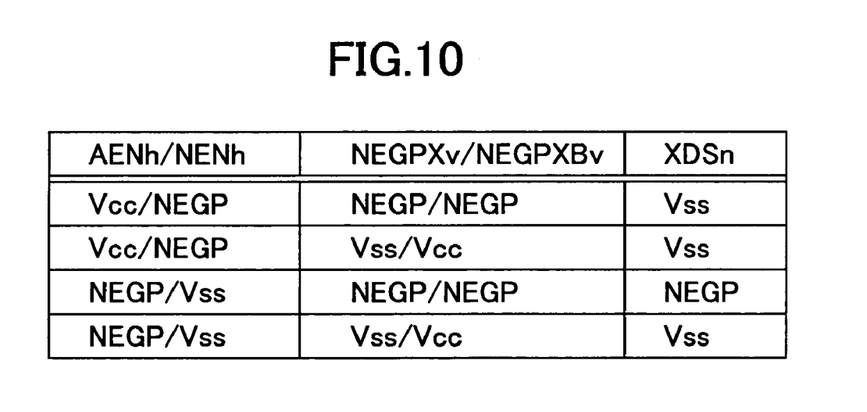
FIG. 10 is a table showing combinations of voltage values of respective signals, and corresponding voltage values of an output signal XDSn of the sector switch.

FIG. 10 is a table showing combinations of voltage values of the signals AENh/NENh and NEGPXv/NEGPXBv, and corresponding voltage values of an output signal XDSn of the sector switch 131. The signals AENh/NENh are NEGP/Vss in the selected state and Vcc/NEGP in the unselected state. The signals NEGPXv/NEGPXBv are NEGP/NEGP in the selected state and Vss/Vcc in the unselected state. As shown in FIG. 10, when the signals AENh/NENh are NEGP/Vss and the signals NEGPXv/NEGPXBv are NEGP/NEGP, a corresponding sector is selected for the erase operation and the output signal XDSn becomes a negative voltage NEGP.

As described above, the sector switches 131 are small circuits each comprising three transistors only. Therefore, the circuit area is considerably reduced in comparison with the related art shown in FIG. 1 where the circuit of FIG. 6 is provided for each sector.

Figure 11:
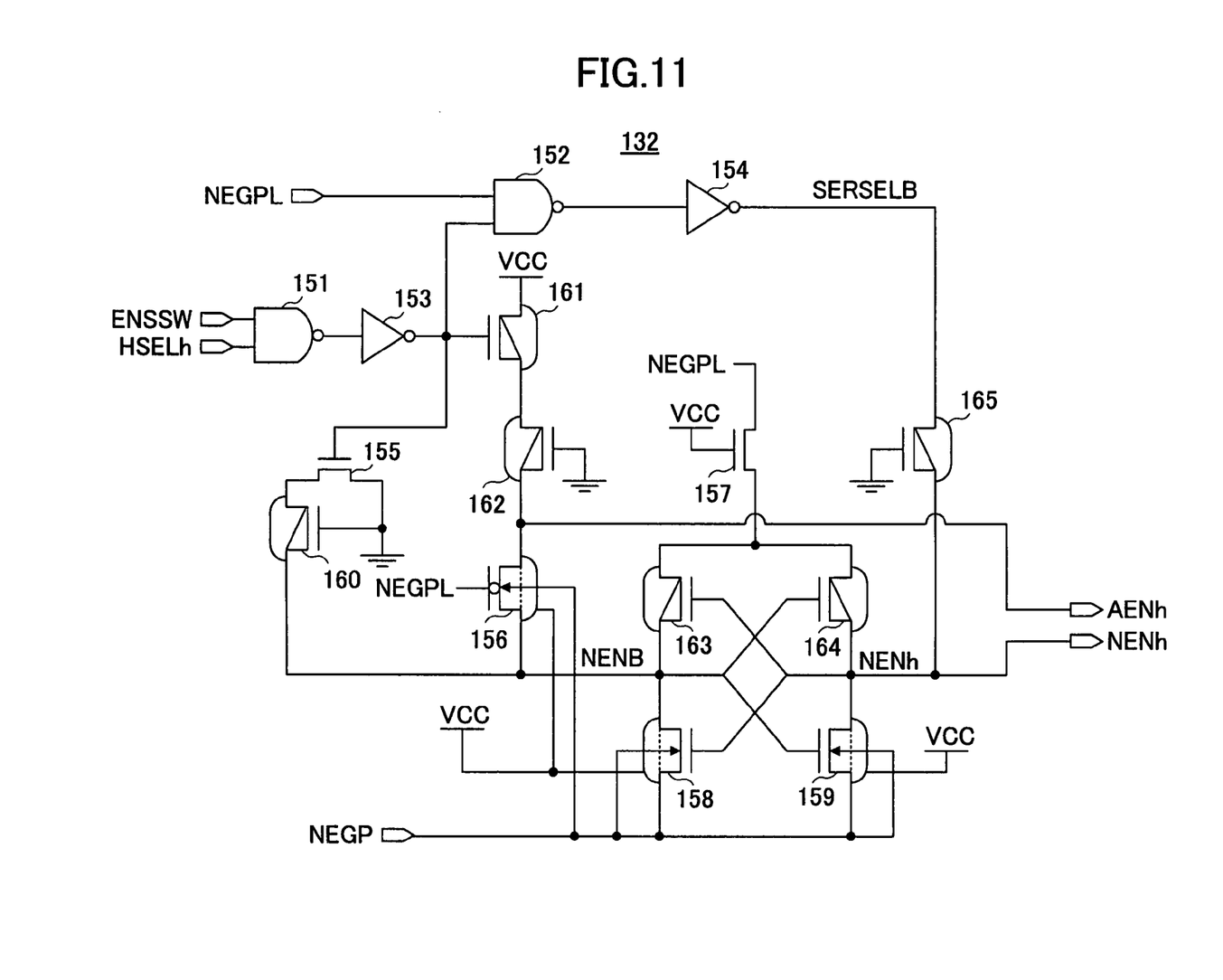
FIG. 11 is a circuit diagram of a horizontal decoder.

FIG. 11 shows a circuit diagram of the horizontal decoder 132.

The horizontal decoder 132 of FIG. 11 comprises NAND circuits 151 and 152, inverters 153 and 154, NMOS transistors 155 through 159, and PMOS transistors 160 through 165. A signal ENSSW is an Enable signal for this circuit. A signal HSELh is a selection signal for selecting a horizontal sector row (FIG. 8). NEGP is a negative voltage supplied from a pump circuit. A signal NEGPL is a negative voltage detection signal, which is switched from Vcc to 0 V when the negative voltage signal NEGP falls below a predetermined negative voltage level.

Signals AEN and NEN are respectively NEGP and Vss when applied to a selected sector, and are respectively Vcc and NEGP when applied to an unselected sector.

Figure 12:
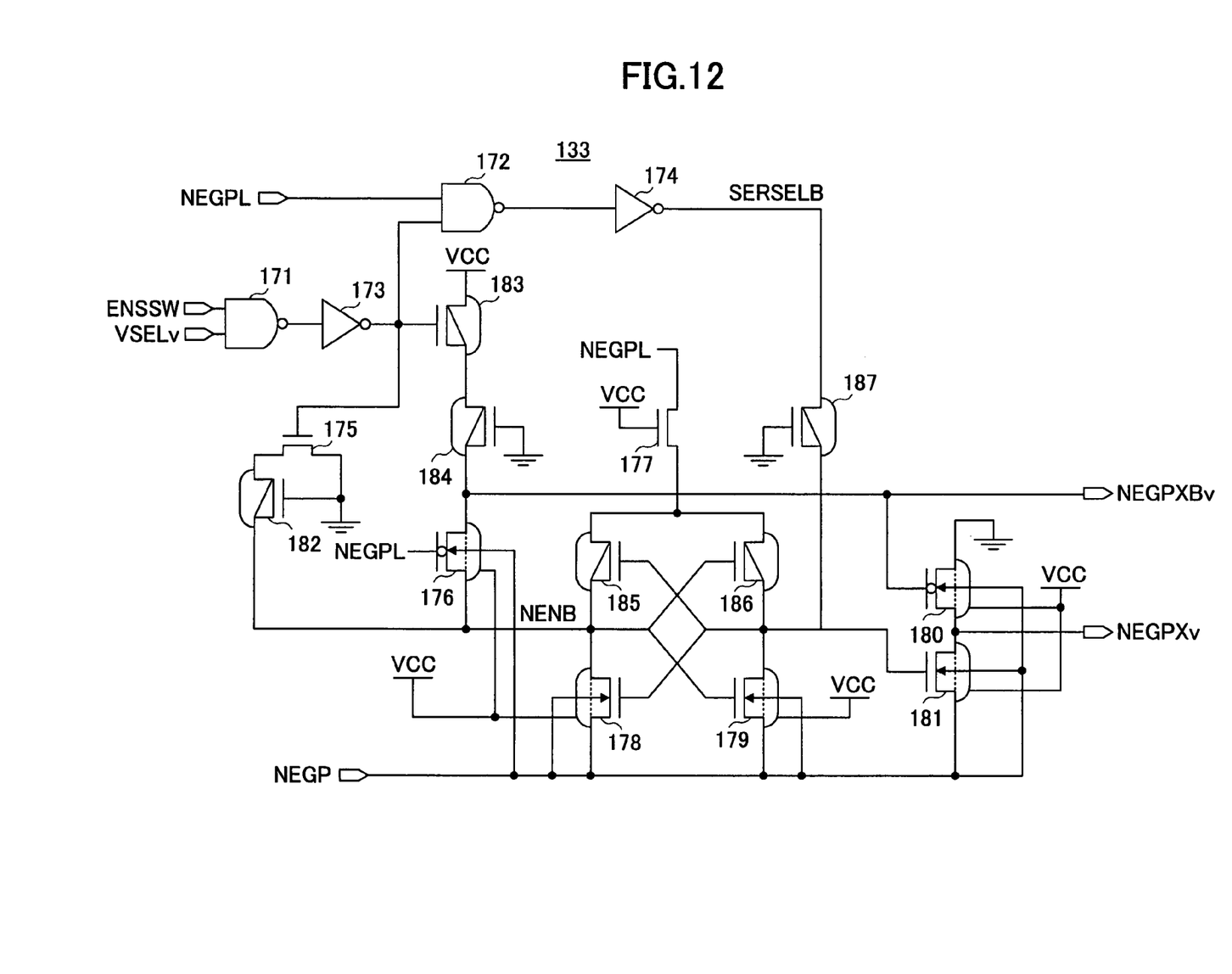
FIG. 12 is a circuit diagram of a vertical decoder.

FIG. 12 is a circuit diagram of the vertical decoder 133.

The vertical decoder 133 of FIG. 12 comprises NAND circuits 171 and 172, inverters 173 and 174, NMOS transistors 175 through 181, and PMOS transistors 182 through 187. A signal ENSSW is an Enable signal for this circuit. A signal VSELv is a selection signal for selecting a vertical sector row (FIG. 8). NEGP is a negative voltage supplied from the pump circuit. The signal NEGPL is a negative voltage detection signal, which is switched from Vcc to 0 V when the negative voltage signal NEGP falls below a predetermined negative voltage level.

The signals NEGPXv/NEGPXBv are NEGP/NEGP when applied to a selected sector, and are Vss/Vcc when applied to an unselected sector.

The voltage signals thus generated by the horizontal decoder 132 of FIG. 11 and the vertical decoder 133 of FIG. 12 are provided to the sector switch 131, so that the sector switch 131 can provide the negative voltage NEGP for erasure.

Figure 13:
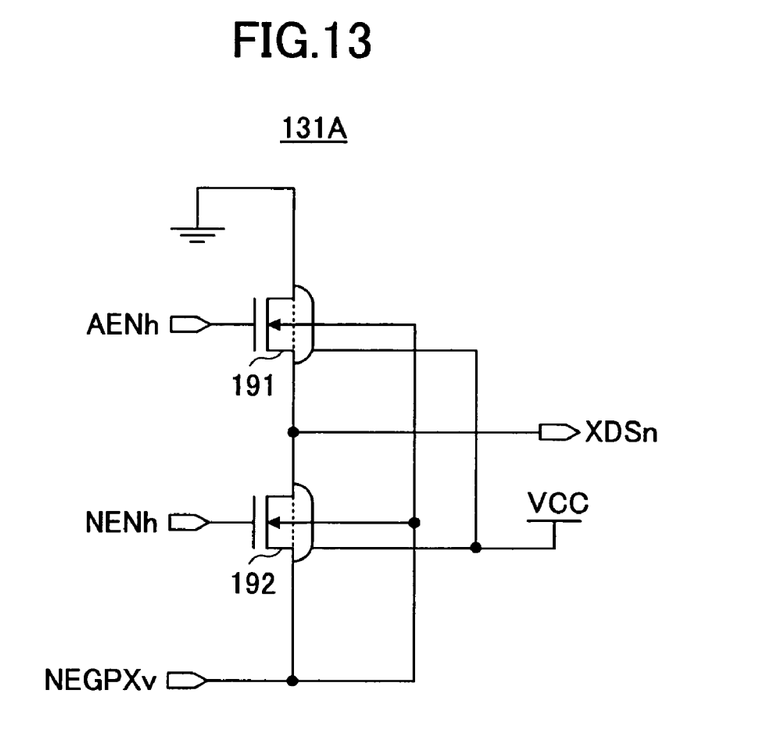
FIG. 13 is circuit diagram of another example of the sector switch.

FIG. 13 is circuit diagram of another example of the sector switch 131.

A sector switch 131A of FIG. 13 comprises NMOS transistors 191 and 192. The signals AENh/NENh are provided to a horizontal sector row by the horizontal decoder 132. The signal NEGPXv is provided to a vertical sector row by the vertical decoder 133.

Figure 14:
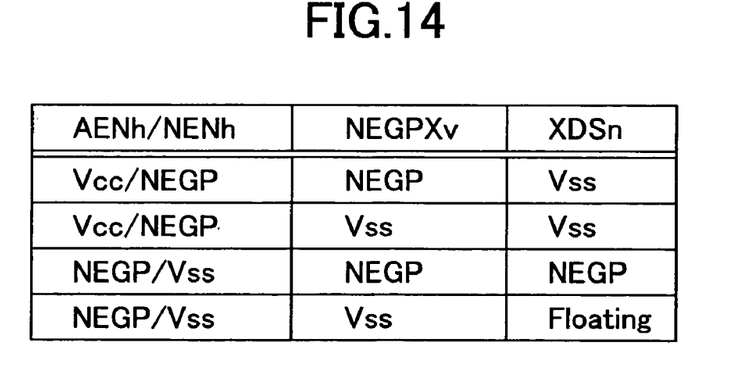
FIG. 14 is a table showing voltage values of respective signals, and corresponding voltage values of the output signal XDSn of the sector switch.

FIG. 14 is a table showing combinations of voltage values of the signals AENh/NENh and NEGPXv, and corresponding voltage values of the output signal XDSn of the sector switch 131A. The signals AENh/NENh are NEGP/Vss in the selected state and Vcc/NEGP in the unselected state. The signal NEGPXv is NEGP in the selected state and Vss in the unselected state. As shown in FIG. 14, when the signals AENh/NENh are NEGP/Vss and the signal NEGPXv is NEGP, a corresponding sector is selected for the erase operation and the output signal XDSn becomes a negative voltage NEGP.

The sector switch 131A according to this embodiment comprises only two transistors as previously mentioned, and therefore the circuit area is further reduced in comparison with the sector switch 131 of FIG. 9. However, if the signals AENh/NENh are NEGP/Vss and a corresponding horizontal row is selected and if NEGPXV is Vss, the XDSn is put in a floating state.

As described above, the sector switch of the nonvolatile semiconductor memory device according to the present invention is provided one for each sector, and the sector is selected by decoder circuits each shared by one or more sectors. A negative voltage for erasure is provided only to the selected sector. Each sector switch only comprises transistors directly connected to a signal output line for providing a negative voltage, and other decoding functions are arranged outside the sectors as the decoder circuit shared by one or more sectors. Accordingly, the sector switch provided in the respective sector can be formed as a small circuit only having driver transistors, thereby allowing considerable reduction of the circuit area.

The present invention is not limited to the specifically disclosed embodiments, and variations and modifications may be made without departing from the scope of the present invention.

What is claimed is:

1. A nonvolatile semiconductor memory device, comprising:
    a plurality of sectors each including a memory cell array;
    a plurality of word line drivers provided in each one of the sectors to drive respective word lines;
    sector switches provided one for each sector, each sector switch being connected to the plural word line drivers in the corresponding sector, adapted to provide a negative voltage to be applied to the word lines to the plural word line drivers when the corresponding sector is selected for an erase operation, and only including transistors directly connected to an output signal line to provide the negative voltage to the plural word line drivers; and
    a decoding circuit shared by one or more sectors, adapted to control the sector switches to allow a sector switch in a selected sector to output the negative voltage and allow a sector switch in an unselected sector to output a voltage different from the negative voltage.

2. The nonvolatile semiconductor memory device as claimed in claim 1,
    wherein the sector switch is connected to a negative voltage signal line to receive the negative voltage from the decoding circuit, the sector switch comprising:
    a first transistor connected between the output signal line and the different voltage; and
    a second transistor connected between the output signal line and the negative voltage signal line.

3. The nonvolatile semiconductor memory device as claimed in claim 2, wherein the sector switch further comprises:
    a third transistor to connect the output signal line to the different voltage when the first and second transistors are closed.

4. The nonvolatile semiconductor memory device as claimed in claim 1,
    wherein the sectors are aligned in a first direction and a second direction, and
    the decoding circuit comprises:
    a first circuit to select one of plural rows of the sectors aligned in the first direction; and
    a second circuit to select one of plural rows of the sectors aligned in the second direction.

5. The nonvolatile semiconductor memory device as claimed in claim 4, wherein the sector switch is connected to a negative voltage signal line to receive the negative voltage from the decoding circuit, the sector switch comprising:
    a first transistor connected between the output signal line and the different voltage; and
    a second transistor connected between the output signal line and the negative voltage signal line, and
    wherein the first circuit is adapted to control opening/closing operations of the first and second transistors, and the second circuit is adapted to control a potential of the negative voltage signal line.

6. The nonvolatile semiconductor memory device as claimed in claim 4, wherein the sector switch is connected to a negative voltage signal line to receive the negative voltage from the decoding circuit, the sector switch comprising:
    a first transistor connected between the output signal line and the different voltage: and
    a second transistor connected between the output signal line and the negative voltage signal line, and
    wherein the first circuit is adapted to control opening/closing operations of the first and second transistors, and the second circuit is adapted to control opening/closing operations of a third transistor and a potential of the negative voltage signal line.

7. The nonvolatile semiconductor memory device as claimed in claim 1, further comprising an X-decoder circuit to select one of the word line drivers in a program operation and a read operation.

8. The device of claim 1, wherein the nonvolatile semiconductor memory device is housed on a terminal.

9. The device of claim 8, wherein the terminal is selected from a group consisting of a personal computer, a minicomputer, a main frame computer, a microcomputer, a hand held device, and a telephonic device.

10. The device of claim 1, wherein the nonvolatile semiconductor memory device is housed on a server.

11. The device of claim 10, wherein the server is coupled to a network.

12. The device of claim 11, wherein the network is the Internet.

13. The device of claim 10, wherein the server is coupled to the network via a coupling.

14. The device of claim 13, wherein the coupling is selected from a group consisting of a wired connection, a wireless connection, and a fiber optic connection.

15. The device of claim 1, wherein the nonvolatile semiconductor memory device is housed on a server.

16. The device of claim 15, wherein the server is coupled to a network.

17. A method for erasing data of a nonvolatile semiconductor memory comprising a plurality of sectors each including a memory cell array, the method comprising:
- driving word lines with a plurality of word line drivers provided in each sector;
- providing a sector switch for each sector, each sector switch being connected to the plural word line drivers in a corresponding sector;
- providing, from the sector switches to the plural word line drivers, a negative voltage to be applied to the word lines when the corresponding sector is selected for an erase operation;
- including only transistors directly connected to an output signal line to provide the negative voltage to the plural word line drivers; and
- controlling the sector switches, using a decoding circuit shared by one or more sectors, to allow a sector switch in a selected sector to output the negative voltage and allow a sector switch in an unselected sector to output a voltage different from the negative voltage.

18. The method of claim 17, wherein each sector switch is connected to a negative voltage signal line to receive the negative voltage from the decoding circuit, each sector switch including:
- a first transistor connected between the output signal line and the different voltage; and
- a second transistor connected between the output signal line and the negative voltage signal line.

19. The method of claim 17, further comprising:
selecting, using an X-decoder circuit, one of the word line drivers in a program operation and a read operation.

20. A computer program product comprising a computer usable medium having control logic stored therein for causing a computer to erase data of a nonvolatile semiconductor memory, said nonvolatile semiconductor memory comprising a plurality of sectors each including a memory cell array, the control logic comprising:
- first computer readable program code means for driving word lines with a plurality of word line drivers provided in each sector;
- second computer readable program code means for providing a sector switch for each sector, each sector switch being connected to the plural word line drivers in a corresponding sector;
- third computer readable program code means for providing, from the sector switches to the plural word line drivers, a negative voltage to be applied to the word lines when the corresponding sector is selected for an erase operation;
- fourth computer readable program code means for including only transistors directly connected to an output signal line to provide the negative voltage to the plural word line drivers; and
- fifth computer readable program code means for controlling the sector switches, using a decoding circuit shared by one or more sectors, to allow a sector switch in a selected sector to output the negative voltage and allow a sector switch in an unselected sector to output a voltage different from the negative voltage.

* * * * *